United States Patent [19]
Ovshinsky

[11] Patent Number: 5,543,737
[45] Date of Patent: Aug. 6, 1996

[54] LOGICAL OPERATION CIRCUIT EMPLOYING TWO-TERMINAL CHALCOGENIDE SWITCHES

[75] Inventor: Stanford R. Ovshinsky, Bloomfield Hills, Mich.

[73] Assignee: Energy Conversion Devices, Inc., Troy, Mich.

[21] Appl. No.: 386,902

[22] Filed: Feb. 10, 1995

[51] Int. Cl.[6] .................................................. H03K 19/00
[52] U.S. Cl. ........................ 326/104; 326/96; 326/136; 257/4; 257/613
[58] Field of Search .................................. 326/104, 136, 326/93, 96, 37–38; 257/2, 4–5, 613

[56] References Cited

U.S. PATENT DOCUMENTS

| | | | |
|---|---|---|---|
| 4,599,705 | 7/1986 | Holmberg et al. | 365/163 |
| 4,731,610 | 3/1988 | Baron et al. | 340/784 |
| 4,782,340 | 11/1988 | Czubatyj et al. | 340/825.83 |
| 4,845,533 | 7/1989 | Pryor et al. | 257/4 |

Primary Examiner—Edward P. Westin
Assistant Examiner—Jon Santamauro
Attorney, Agent, or Firm—Marvin S. Siskind; David W. Schumaker; Marc J. Luddy

[57] ABSTRACT

A logic family employing a plurality of two-terminal chalcogenide switches as logic gates therein. Preferably the two-terminal chalcogenide switches are chalcogenide threshold switches. The logic can employ multi-phase clocking such as four-phase clocking.

18 Claims, 3 Drawing Sheets

5,543,737

LOGICAL OPERATION CIRCUIT EMPLOYING TWO-TERMINAL CHALCOGENIDE SWITCHES

FIELD OF THE INVENTION

The instant invention relates to a novel logic family. More specifically the present invention relates to a logic family which employs two-terminal chalcogenide switches as the logic gates therein.

BACKGROUND OF THE INVENTION

In the field of electronic computers which is constantly striving for improvements in operational speed and performance, the silicon semiconductor devices used in most electronic computers have begun to reach a limit in operating speed and device size/packing density. Computer designers are always looking to reduce the switching time of switching circuits and to increase their packing density so as to permit the execution of the greatest number switching operations per unit time and yet reduce the space occupied by the switching circuits. Josephson devices have attracted keen attention in the past as one potential novel breakthrough toward satisfying these requirements, and thus logic circuits which incorporate these devices have been heavily studied.

The use of Josephson junctions as electronic circuit elements only became possible after 1962 when the Josephson effect was discovered. At that time the only known superconducting materials had such low critical temperatures (i.e., temperatures below which the material becomes superconducting) that any circuit using Josephson junction elements required a source of liquid helium to maintain the low temperature required. Since that time the improvements in low-temperature technology, and the discovery of high $T_c$ superconducting materials, have made these limitations less sedous, but other practical considerations still plague commercialization of superconducting logic circuits.

Josephson junctions are highly-unusual, nonlinear circuit elements which can be used to design circuits having many interesting properties. The primary advantages of these junctions are said to be their low power requirements and high operating speeds compared with conventional, nonlinear circuit elements. That is, the Josephson device exhibits high-speed switching operations with low power dissipation and high sensitivity in accordance with the Josephson effect produced in a superconductive state at very low temperatures. Therefore, the Josephson device has, in the past, given rise to expectations for materialization of super-high speed computers.

The Josephson device, in its basic construction, comprises two superconductors joined to each other through the medium of a thin insulating film (Josephson tunneling junction) as typified by the Josephson tunnel junction device. In this construction, when the current supplied to the junction exceeds the junction's critical current, the device is transferred from the zero-voltage state to the voltage state (a switching operation). That is, the operation of the device is based on the existence of two states for the gate (Josephson junction) and the fact that the gate can be switched from one state to the other by means of a magnetic field or applied current. One of these states is a pair tunneling state of the junction in which current can flow through the barrier region without any voltage drop. The other state is a single-particle tunneling state in which the current flows with a voltage across the junction equal to 2 Delta, where Delta is the energy gap of the superconductor. For tin, 2 Delta equals about 1 mV at 1.7 K. The transition from one state to the other can be brought about by exceeding the critical current for the Josephson junction. The critical current, $I_j$, is defined as the largest zero voltage current the junction can carry. Therefore, the device's I–V characteristics are such that the voltage across the junction remains at zero until the current reaches a critical value at which time the voltage across the device jumps to a finite value and thereafter varies slowly with further increase in current. The critical current value is dependent upon the magnetic field applied to the Josephson device.

U.S. Pat. Nos. 3,626,391; 3,281,609; 3,758,795; 3,825,906, etc. disclose the concept of utilizing a Josephson junction for Josephson circuit devices as, for example, a memory cell, logic gate or shift register.

There are two basic types of Josephson logic gates, current injection gates and magnetically controlled gates. All present day Josephson integrated circuits utilize one or both of these gate types. The fastest logic gates utilize a combination of the two. All of these types of Josephson integrated circuits are subject to the disadvantages described hereinbelow.

Conventional superconductive logic circuits are roughly classified by the input system into the magnetic coupling type and the current injection type. In a superconductive logic circuit of magnetic coupling type, an input signal is magnetically coupled to a loop including a Josephson junction and inductance, and logic operations are performed by transformation of the Josephson junction to the non-zero voltage state as shown in U.S. Pat. No. 3,978,351. In this example, the Josephson junction and the inductance constitute a magnetic flux quantum interferometer, and the product of the inductance L and the and the critical current $I_j$ of the Josephson junction is selected to be close to one magnetic flux quantum. Therefore, when the critical current $I_j$ is made small for energy consumption, a large inductance L is required, making it difficult to realize a compact circuit and reducing the operating speed. Conversely, when the inductance L is made smaller for obtaining a higher operating speed, the value of the critical current $I_j$ becomes greater and energy consumption increases. Further, the circuit is subject to the influence of external magnetic noise, stray inductance and so on, resulting in extreme fluctuations and unstable operation. Such a circuit is also defective in that uniform and efficient connection of a number of input wires is structurally difficult.

A superconductive logic circuit of current injection type has been an improvement in that it does not involve a magnetic flux quantum interferometer. In a superconductive logic circuit of current injection type, current is directly supplied to the Josephson junction for switching into the non-zero voltage state in order to perform logic operations. A prior art superconducting logic circuit of the current injection type which does not involve a magnetic flux quantum interferometer is shown in IEDM "Josephson Direct Coupled Logic (DCL)" (1492, 12), IBM. According to this example, the defects of the superconductive logic circuit of the magnetic coupling type which involve magnetic flux quantum interferometer are solved. However, the threshold for determining the sensitivity is solely determined by the switching of the non-zero voltage state of a single Josephson junction so that only a current gain of at most 1 may be obtained. Therefore, although it is advantageous to use it as a switch, it is difficult to apply it to various kinds of logic circuits.

In an article entitled "Threshold Logic" by Daniel Hampel and Robert Widner, published in IEEE Spectrum, May, 1971, pp. 32–39, threshold logic gates and means for implementing such gates with large scale integrated circuitry are disclosed. As pointed out in the article, threshold logic gates have increased logic power over standard Boolean logic gates such as AND, OR, NOR gates. Basically, a threshold logic gate receives N logic inputs, weights the N inputs either equally or with unequal weights, sums the weighted inputs, and provides a logic output if the sum is greater than or equal to a threshold weighting factor.

Conventional threshold logic is implemented by using either of the current sources and a threshold detector, or magnetic flux summing techniques described above. Current summing techniques and magnetic flux summing techniques require precision in generating the analog quantity which will be compared to the threshold. Precision is also required when Josephson devices are used. The source of analog precision is provided in the Josephson case by voltage referred to above as Delta. The parameter Delta is essentially the gap in the energy spectrum of the conduction electrons of the superconductor being considered and as such is a material constant.

Logic circuits incorporating Josephson junctions have other disadvantages in addition to those discussed above. For instance, some switching circuits in Josephson junction technology have the severe disadvantage of not being automatically resetting, thus requiring additional switches for their reset operation. While this would not pose a technical problem, the economics of any device incorporating the state of the art switching circuits must suffer considerably through long cycle times. Another disadvantage is the problem of eliminating cross-talk between Josephson devices in Josephson logic arrays, which are due to current transients when a device switches. Also, the current-voltage characteristic of a Josephson tunnel junction device is known to have an unstable region at low voltages. If one attempts to voltage bias the device in the unstable region, its operating point jumps back and forth between the supercurrent state (V=0) and the finite voltage state (V not=0, typically V=2 DELTA, the gap voltage of the superconductor). This problem is known as relaxation oscillation.

Therefore, the conventional Josephson device has been unable to simultaneously satisfy three conditions, i.e., (1) the size reduction of the device which permits integrated circuits in high density, (2) the high sensitivity which produces wide operation margin, and (3) perfect isolation between the input and output signal currents in the device. The three conditions are indispensable to the components of future electronic computers to obtain stable, high-speed logic circuit operation.

Another disadvantage of Josephson junction technology is the large number of processing steps required to produce the devices. A primary factor determining the efficacy of integrated circuit processes and the concomitant yield thereof is the number of steps comprising the process. For example, if a process consists of twelve steps and the expected yield of each of the steps is ninety percent, then the yield of operative devices at the completion of the twelve step process is $0.9^{12}$, or approximately 28%. If, however, the process consists of eight steps, each with a yield probability of ninety percent, then the final yield for the eight step process is $0.9^8$, or 43%. Thus by eliminating steps, an improvement in yield is achieved without any improvement in the quality of the processing. Additionally, large numbers of processing steps engender problems with adhesion, step coverage and damage to prior deposited layers. The longer the fabrication sequence, the lower is the device throughput of the process.

Josephson junction logic integrated circuit fabrication involves approximately 12 deposition steps, 12 photoresist steps, an anodization step and a junction barrier formation step. Typically the process comprises depositing four superconducting layers, viz., the ground plane, the lower Josephson electrode, the Josephson counter electrode and the control lines. Interconnections, interferometer loops and other circuit elements are formed from the last three layers. Each superconductive layer is separated from an adjacent superconductive layer by an insulator layer that is patterned to form vias which provide required electrical connections between layers. The deposition of resistors, additional insulator layers for increased inductance, passivation layers and anodization are steps utilized to complete the circuit. Thus it is appreciated that a minimum of nine separate thin films and patterning steps are required in this process. Therefore a reduction in the number of processing steps required to form the logic circuits is desirable.

A switching technology which is similar to Josephson junction technology and which has been around for 30 years is the Ovonic threshold switch. This device starts in the "off" or non-conducting state and a critical voltage is required to switch it on. Its I–V characteristic looks like that of the Josephson junction, but the current and voltage axes are transposed. Its switching speed, like that of the Josephson junction, is also limited by the device capacitance, but since the devices are thicker, it exhibits a lower capacitance for a given lithography. Additionally, the speed/power potential of the Ovonic Threshold Switch compares favorably with the silicon and gallium arsenide technologies as well as the practical implementations of Josephson logic.

Now that the end of the dramatic density increases in silicon technology is at hand, the real need in advanced logic is to find a superior future technology which can replace silicon transistors.

Therefore the object of this invention is to define a novel logic family which employs chalcogenide Ovonic threshold switches as the logic gates therein.

SUMMARY OF THE INVENTION

The present invention defines a logic family employing a plurality of two-terminal chalcogenide switches as logic gates therein. Preferably the two-terminal chalcogenide switches are chalcogenide threshold switches. The logic can employ multi-phase clocking such as four-phase clocking.

DETAILED DESCRIPTION OF THE INVENTION

Figure 1:
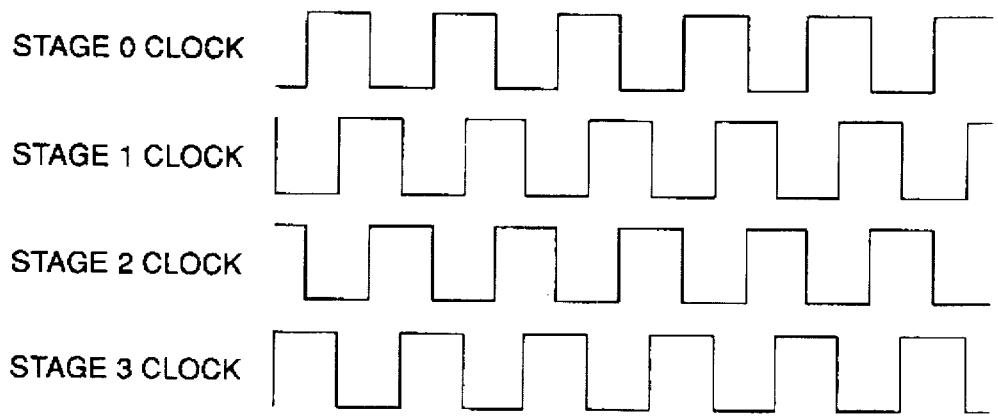
FIG. 1 depicts the power cycling of a four-phase clocking cycle for instituting two terminal logic, specifically shown is a four-phase clocking cycle where each subsequent clocking wave is 90 degrees out of phase from the previous clocking wave.

A logic family is defined as a set of all possible logic circuits which can be formed using a particular logic gate or switching element. The present inventors have developed a logic family based upon two-terminal chalcogenide switches. The materials and processes for constructing these switches and their electronic characteristics are well known in the art and, as such, will not be repeated herein.

A logic family has a number of fundamental requirements necessary to it's use in computers. The most fundamental of these requirements is the ability to convert a binary "one" to a binary "zero" and vice versa. This ability is known as inversion. The second most important consideration is the ability to perform a logical operation. Common logic operations are AND, OR, NAND, NOR, etc. There are others, but any one of these will be sufficient. The third major consideration is that the logic family must have the ability to produce gain. That is, the output from one logic circuit must have the ability to provide input for more that one other circuit at the same time. Finally, if the logic gate or switching element has a latching property (i.e. the device does not automatically shut off, but must be turned off), means must be provided for resetting the gate/switch for subsequent switches. Having exhibited all of these requirements, a gate/switch and the logic family derived therefrom will have the ability to be used as computer logic.

While these are the only technical requirements for a logic family, there are other important engineering criterion which must be placed upon the gate/switching device for the purpose of practical implementation. First, it should be noted that the switching speed of the gate/switch is directly related to the speed of the computer and therefore, the lower the switching speed of the gate.switch, the faster the computer can be. Next, the size of the device directly determines the maximum possible density of the circuitry. Also, the power dissipated by the device must be considered in the design of the circuit so the thermal energy generated may be removed properly. Additionally, the logic circuits must be fairly resistant to noise. That is, the gate's/switch's noise immunity must be high enough that no false signals are introduced into the system. Finally, the costs of production (i.e. cost of raw materials, manufacturing, labor etc.) are another constraint to practical implementation of any new logic family.

The present logic family based on two-terminal chalcogenide switches meet all of the technical requirements, as well as, all of the engineering requirements.

First we shall discuss the technical limitations of a logic family in comparison with the capabilities of the threshold switch logic family of the instant invention, with reference to the figures.

One of the technical considerations mentioned above is a gate's/switch's latching property. A two-terminal chalcogenide threshold switch, such as the Ovonic Threshold Switch (OTS), has the latching property. That is, once it's threshold voltage is reached, the OTS switches on and current is allowed to pass therethrough. Once switched on, the OTS remains on until the current passing therethrough falls below a critical value known as the holding current.

Figure 2:
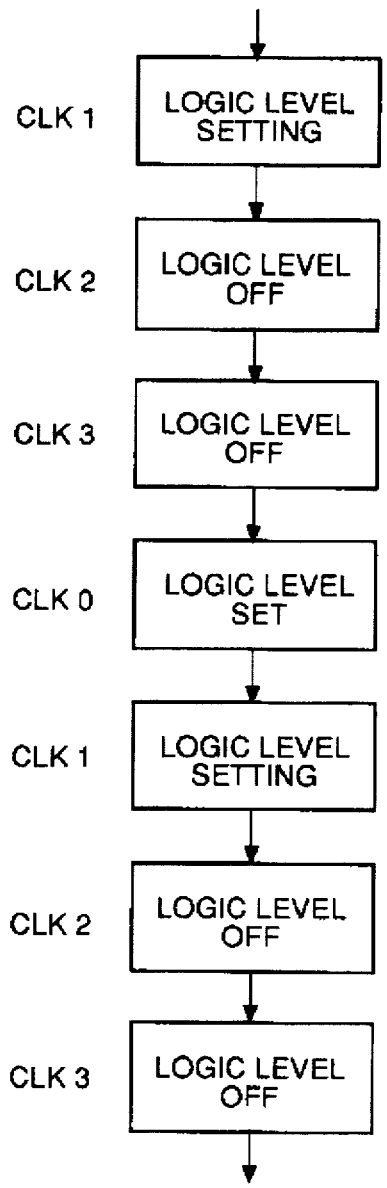
FIG. 2 depicts the manner in which four-phase clocking allows the logical output of a logic circuit to be passed to the next logic circuit in a logic chain without affecting other logic circuits in the logic chain.

Therefore, to insure that the logic gates/OTS's of the logic family of the instant invention turn off when required, the current passing therethrough must be stopped. To accomplish this the instant inventors have turned to a four-phase clocking system. FIG. 1 shows the power signals for a four-phase clocking system. It can be seen that the four stages of the clocking system are each 90 degrees out of phase from the stage preceding it. This four-phase clocking system allows for proper transfer of data from one logic circuit to the next. To visualize just how this is accomplished, look at the flow chart depicted in FIG. 2. The clock cycle is at a point at which both the stage 0 and stage 1 clocks are powered and the stage 3 and stage 4 clocks are unpowered. At this point the logic circuit being supplied by clock 0 have performed their logical function and are transferring their output to the next logic circuit(s) in their logic path, which are powered by the stage 1 clock. Therefore, the logic circuits powered by the stage 1 clock are said to be "being set". It should be noted that since both the stage 2 and 3 clocks are unpowered during this time period, the logic circuits and their OTS's are closed and no information is passed into or out of these circuits (thus aiding in providing for noise immunity). Once the stage 1 clock logic circuits are set, the stage 0 clock is powered down and the stage 2 clock is powered up. Now the logical output of the stage 1 clock logic circuits is passed to the stage 2 clock logic circuits. Then the stage 1 clock is powered down and the stage 3 clock is powered up. The cycle is then completed by powering down the stage 2 clock and powering up the stage 0 clock again. While FIG. 1 depicts four-phase clocking of equal on and off duration (i.e. a 50% duty cycle) with each phase being offset by 90 degrees from the preceding clock, there are many other ways to implement four-phase clocking. Four-phase clocking is well known in the two-terminal logic art and is described by W. F. Chow, "Principles of Tunnel Diode Circuits", John Wiley & Sons, Inc. 1964, pp. 253–254.

Figure 3:
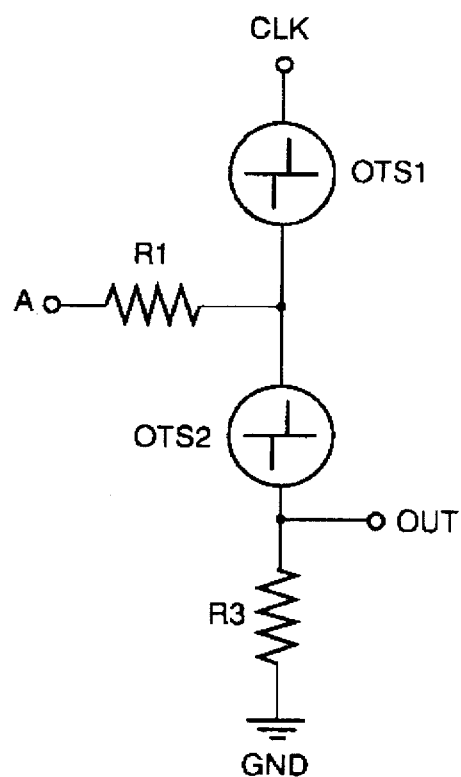
FIG. 3 depicts a single input inverting buffer by inverting the input and providing the boosted inverted signal as the output.

Another one of the technical requirements is the ability to convert a binary "one" to a binary "zero" and vice versa. This is known as INVERSION. FIG. 3 depicts a circuit which provides the instant logic family with the INVERSION ability. This circuit may also be thought of as an inverting buffer, since the signal is merely inverted and passed to the next circuit, having had no logical operation performed upon it. The circuit includes two OTS's OTS1 and OTS2 which are connected in series. A data input point A is connected to an input resistor R1, which is in turn connected between the two OTS's. The power clocking signal is input at the CLK terminal of OTS1 which is opposite the junction point of R1, OTS1 and OTS2. The terminal of the second switch OTS2 which is opposite that of the R1-OTS1-OTS2 junction point is connected to ground (GND) through a resistor R3. A data output point is connected between the second switch OTS2 and the R10 resistor. In general, the resistance value of R1 is much greater than the resistance value of R3. During the operation of this circuit the clock is high, i.e. the circuit is powered and the potential at CLK is high. Accordingly, if the input signal at A is also high, there is not enough potential across OTS1 to cause it to switch, i.e. exceed its threshold voltage. There is also not a large enough potential across OTS2 to cause it to switch. Therefore, the potential of the output at OUT is low. Conversely, if the input signal at A is low, there is a large enough potential across OTS1 to exceed its threshold and the impedance of the switch drops. This then creates a large enough potential across OTS2 to allow it to switch and the potential of the output signal is pulled high.

Figure 4:
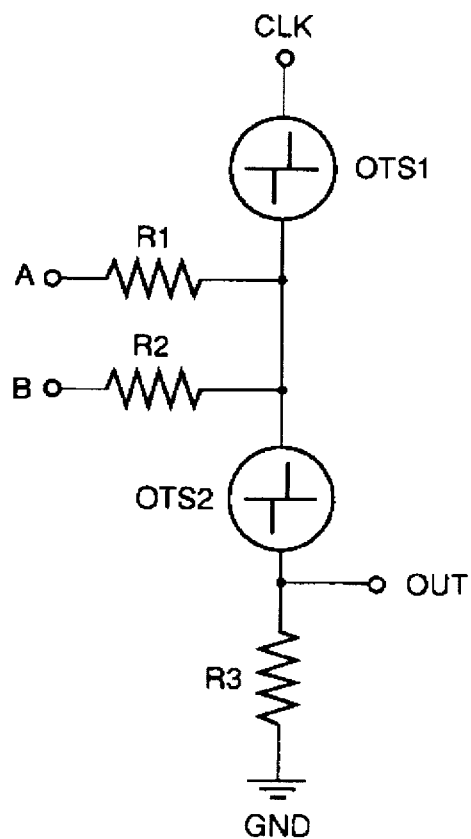
FIG. 4 depicts a multiple input logic circuit which performs a logical operation using two terminal chalcogenide switches, this circuit also preforms an inversion and provides gain.

Yet another of the technical requirements for a logic family is the ability to perform a logical operation. FIG. 4 depicts a circuit within the instant logic family which fulfills this requirement. The circuit is basically the same circuit as the INVERSION circuit of FIG. 3 except that there is an additional input B with its attendant input resistor. Therefore, there are two inputs A and B each having their respective input resistors R1 and R2. The ground resistor has been designated R3 in this circuit. As in the INVERSION circuit, the resistance values of resistors R1 and R2 are much larger than the resistance value of ground resistor R3. This circuit operates in much the same manner as the INVERSION circuit of FIG. 3, the main difference being that there are now two inputs and a logical operation is performed upon the inputs. Again during operation of this circuit the potential at CLK is high. If the input at either A or B is high or the input at both A and B are high, OTS1 does not switch. Therefore OTS2 does not switch and the output is low. However if the input at both A and B is low, OTS1 switches. This causes the potential across OTS2 to be high causing it to switch and pulling the output at OUT high.

Therefore, depending upon the nomenclature used, this is either a NOR gate or a NAND gate. That is, if a low potential is a logical "0" and a high potential is a logical "1" then the circuit acts as a NOR gate. Conversely, if a low potential is a "1" and a high potential is a "0" then the circuit acts a NAND gate.

Figure 5:
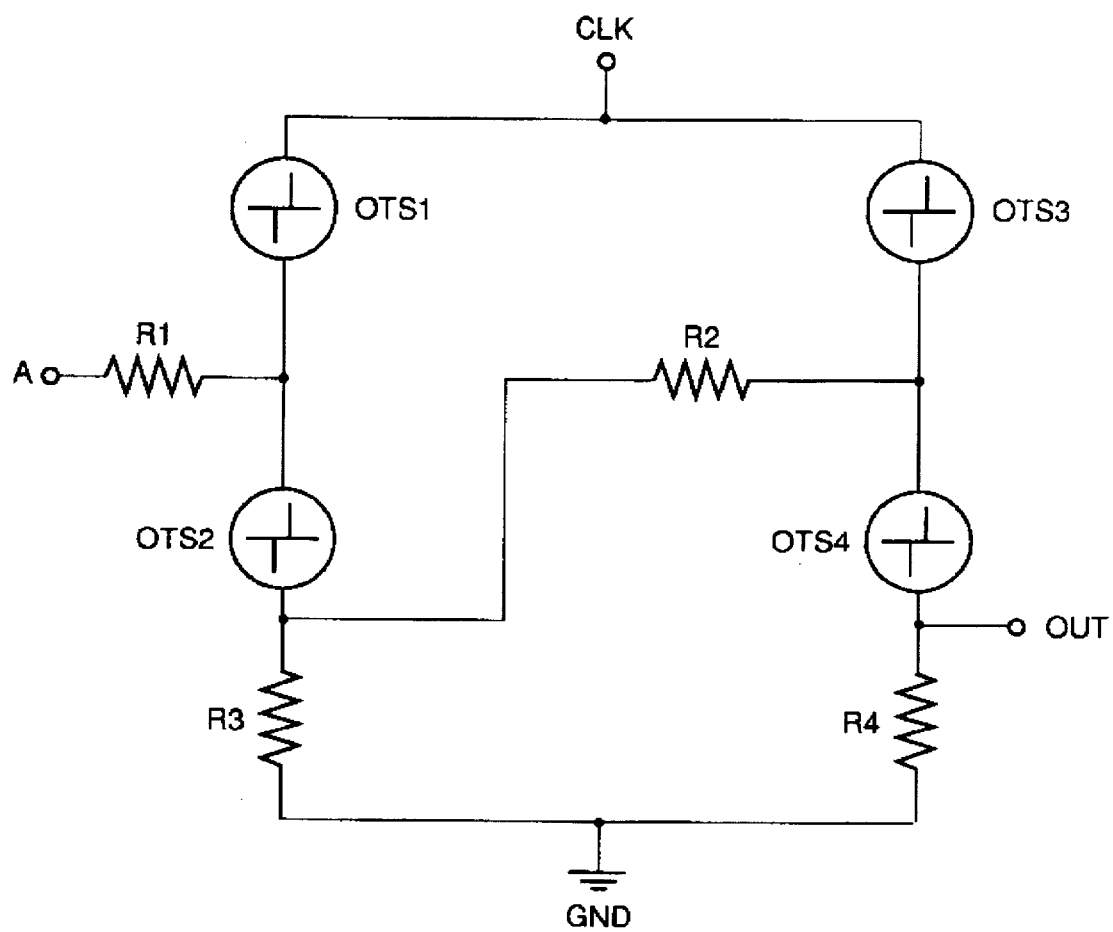
FIG. 5 depicts a non-inverting buffer which is formed by joining two of the inverter circuits of FIG. 3 together such that the output of the first inverter is fed to the input of the second inverter, using this configuration, the input signal is essentially passed through the total circuit and is merely boosted in power.

A final example of a logic circuit from the logic family of the instant invention is the non-inverting buffer depicted in FIG. 5. This is essentially two inverting buffers connected such that the output of the first inverter is fed to the input of the second inverter. Thus, the signal is inverted and re-inverted in a single clock cycle. Therefore, the signal is passed essentially unchanged through this circuit. Again the resistance values of input resistors R1 and R2 is much larger that the resistance values of ground resistors R3 and R4.

The last technical consideration is that the logic family must have the ability to produce gain. The circuits described above inherently produce gain. That is, the output at OUT of each of the aforedescribed circuits is pulled to nearly the potential of the clock powering signal, i.e. the potential at CLK, with an impedance substantially lower than the input impedance. Therefore, no special additional gain circuitry is required.

Therefore, all of the fundamental requirements of a logic family have been met. While the instant disclosure has presented specific circuitry which belongs to the present logic family, they are merely exemplary and are not intended to limit the scope of the invention. One skilled in the art will recognize that there are a multitude of other circuits within the instant logic family which can be created to perform similar tasks to those disclosed.

As pertains to the engineering criterion which must be placed upon the gate/switching device for the purpose of practical implementation. First, it should be noted that the switching speed of chalcogenide threshold switches can be tailored to be much faster than the practical implementations of any known switching devices. Also, the size of the OTS device can be much smaller than any conventional switching elements now in use. Also, the power dissipated by the OTS device is very small because the power is directly related to the devices size and the OTS can be made very small. Additionally, the OTS is not susceptible to minor voltage fluctuations or outside magnetic fields which makes them fairly resistant to noise. Finally, the costs of production of OTS devices is much less than other technologies in use.

While the invention has been described in connection with preferred embodiments and procedures, it is to be understood that it is not intended to limit the invention to the described embodiments and procedures. On the contrary it is intended to cover all alternatives, modifications and equivalence which may be included within the spirit and scope of the invention as defined by the claims appended hereinafter.

I claim:

1. A logic operational circuit comprising:
   at least one logic gate wherein each logic gate comprises:
   a pair of two-terminal chalcogenide switches in series; and
   at least one resistor connected at one end to a point between said pair of two-terminal chalcogenide switches.

2. The logical operational circuit of claim 1, wherein said two-terminal chalcogenide switches are chalcogenide threshold switches.

3. The logical operational circuit of claim 1, wherein said two-terminal chalcogenide switches employ multi-phase clocking.

4. The logical operational circuit of claim 3, wherein said multi-phase clocking is four-phase clocking.

5. The logical operational circuit of claim 4, wherein said four-phase clocking has a fifty percent duty cycle.

6. An INVERSION circuit comprising:
   a first chalcogenide threshold switch connected in series to a second chalcogenide threshold switch;
   an input point connected to one terminal of an input resistor, the other terminal of said input resistor being connected to a point between the series connected threshold switches;
   a circuit powering point connected to the terminal of said first threshold switch opposite that of the junction of said first and second threshold switches;
   a ground resistor, one terminal of said ground resistor connected to the terminal of said second threshold switch opposite that of the junction of said first and second threshold switches and the other terminal of said ground resistor connected to ground;
   a signal output terminal connected between said second threshold switch and said ground resistor.

7. The INVERSION circuit of claim 6, wherein the resistance value of said input resistor is much greater than the resistance value of said ground resistor.

8. The INVERSION circuit of claim 7, further comprising a second INVERSION circuit wherein said output terminal of the first INVERSION circuit is connected to said input point of the second INVERSION circuit thereby forming a noninverting buffer circuit.

9. The INVERSION circuit of claim 6 further comprising a clocking means applied to said circuit powering point.

10. The INVERSION circuit of claim 9, wherein said clocking means is multi-phase clocking.

11. The INVERSION circuit of claim 10, wherein said clocking means is four-phase clocking.

12. The logic operational circuit of claim 11, wherein said four-phase clocking has a fifty percent duty cycle.

13. A logical operational circuit comprising:
   a first chalcogenide threshold switch connected in series to a second chalcogenide threshold switch;
   a plurality of input points each individually connected to one terminal of one of a plurality of input resistors, the other terminal of each of said input resistors being connected to a point between the series connected threshold switches;

a circuit powering point connected to the terminal of said first threshold switch opposite that of the junction of said first and second threshold switches;

a ground resistor, one terminal of said ground resistor connected to the terminal of said second threshold switch opposite that of the junction of said first and second threshold switches and the other terminal of said ground resistor connected to ground;

a signal output terminal connected between said second threshold switch and said ground resistor.

14. The logical operational circuit of claim 13, wherein the resistance values of said plurality of input resistors is much greater than the resistance value of said ground resistor.

15. The logical operational circuit of claim 13 further comprising a clocking means applied to said circuit powering point.

16. The logic operational circuit of claim 15, wherein said clocking means is multi-phase clocking.

17. The logic operational circuit of claim 16, wherein said clocking means is four-phase clocking.

18. The logic operational circuit of claim 17, wherein said four-phase clocking has a fifty percent duty cycle.

* * * * *